(12) United States Patent
Lee et al.

(10) Patent No.: US 8,946,874 B2
(45) Date of Patent: Feb. 3, 2015

(54) IC IN-PROCESS SOLUTION TO REDUCE THERMAL NEUTRONS SOFT ERROR RATE

(75) Inventors: Yung-Huei Lee, Danshui (TW); Chou-Jie Tsai, Tainan (TW); Chia-Fang Wu, Tainan (TW); Wei-Cheng Chu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 155 days.

(21) Appl. No.: 13/013,424

(22) Filed: Jan. 25, 2011

(65) Prior Publication Data

US 2012/0187549 A1 Jul. 26, 2012

(51) Int. Cl.
| H01L 23/552 | (2006.01) |
| H01L 23/522 | (2006.01) |
| H01L 23/29 | (2006.01) |
| H01L 23/31 | (2006.01) |

(52) U.S. Cl.
CPC ............ H01L 23/522 (2013.01); H01L 23/291 (2013.01); H01L 23/3192 (2013.01); H01L 23/552 (2013.01); H01L 2924/0002 (2013.01)
USPC ..................... 257/659; 257/660; 257/E21.211

(58) Field of Classification Search
CPC ............ H01L 23/556; H01L 2924/00; H01L 2224/48091; H01L 2224/48227; H01L 2224/48465; H01L 2924/00014; H01L 2224/48247; H01L 2224/48472; H01L 23/552; H01L 2924/0002; H01L 2924/10253; H01L 23/291; H01L 23/3192; H01L 2924/14; Y10S 257/913
USPC ................. 257/659, 660, E21.211, E23.214; 438/584
See application file for complete search history.

(56) References Cited

U.S. PATENT DOCUMENTS

| 3,887,807 | A | * | 6/1975 | Poignant et al. ......... 250/390.02 |
| 4,580,157 | A | | 4/1986 | Honda |
| 5,395,783 | A | | 3/1995 | Baumann et al. |
| 6,037,668 | A | * | 3/2000 | Cave et al. .................... 257/784 |
| 6,239,479 | B1 | * | 5/2001 | Hwang et al. ................. 257/659 |
| 6,255,719 | B1 | | 7/2001 | Kuriyama et al. |
| 6,436,737 | B1 | | 8/2002 | Malladi |
| 7,180,114 | B2 | | 2/2007 | Nakamura et al. |

(Continued)

FOREIGN PATENT DOCUMENTS

| CN | 1674128 A | 9/2005 |
| CN | 1674218 A | 9/2005 |

(Continued)

OTHER PUBLICATIONS

Baumann, R., "Soft Error Characterization and Modeling Methodologies at TI: Past, Present, and Future," TRC 2000, Oct. 31, 2000, 18 pages, Texas Instruments.

Primary Examiner — Duy T Nguyen
(74) Attorney, Agent, or Firm — Slater & Matsil, L.L.P.

(57) ABSTRACT

Integrated Circuits and methods for reducing thermal neutron soft error rate (SER) of a digital circuit are provided by doping a protection layer on top of the metal layer and in physical contact with the metal layer of the digital circuit, wherein the protection layer is doped with additional thermal neutron absorbing material. The thermal neutron absorbing material can be selected from the group consisting of Gd, Sm, Cd, B, and combinations thereof. The protection layer may comprise a plurality of sub-layers among which a plurality of them containing additional thermal neutron absorbing material.

19 Claims, 6 Drawing Sheets

(56) References Cited

U.S. PATENT DOCUMENTS

2005/0205953 A1\* 9/2005 Nakamura et al. ............ 257/428
2006/0001091 A1\* 1/2006 Kim .............................. 257/347
2007/0057305 A1\* 3/2007 Oates et al. ................... 257/301

FOREIGN PATENT DOCUMENTS

| CN | 1909978 A | 2/2007 |
|----|-----------|--------|
| JP | 2005268730 A | 9/2005 |
| JP | 2008195756 A | 8/2008 |

\* cited by examiner

IC IN-PROCESS SOLUTION TO REDUCE THERMAL NEUTRONS SOFT ERROR RATE

BACKGROUND

Many digital integrated circuits or devices rely on electrical charge on a capacitive node for storage of a digital signal or data, and thus such devices are sensitive to events which transport unintended charge to the node. A soft error is a random error induced by an event that corrupts the data stored in the device but does not damage the device itself. Soft errors can be caused by radiation, electromagnetic interference, or electrical noise. With continuing technology scaling, circuits become more sensitive to soft errors. There are three primary radiation sources causing soft errors: alpha particles, high-energy cosmic rays, and neutron-induced boron fission. Alpha particles (sometimes called alphas) originate from radioactive impurities in chip and package materials. Alphas induce soft errors by generating charges in the silicon device. On the other hand, cosmic rays, predominantly neutrons, indirectly generate charges by colliding with nuclei within the chip. The third source, boron fission, occurs when a low-energy (thermal) neutron hits a B nucleus, which then breaks up into an alpha and a lithium recoil. This source gives a significant contribution of soft error if specific materials, in particular boron phosphor-silicate glass (BPSG), have been used in the fabrication of the chip. The contribution of boron fission to the SER can be reduced by eliminating BPSG from the process flow. If the use of BPSG is necessary, enriched B could be used in the BPSG layers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Illustrative embodiments will be discussed with respect to the integrated device CMOS fabrication process. Those of skill in the art will readily recognize that there are many variations which implement equivalent functions and the illustrative embodiments are made for illustrative purpose only.

The process of manufacturing semiconductors or integrated circuits (commonly called ICs, or chips) typically consists of more than a hundred steps, during which hundreds of copies of an integrated circuit are formed on a single wafer. Generally, the process involves the creation of more than eight patterned layers on and into the substrate, ultimately forming the complete integrated circuit. This layering process creates electrically active regions in and on the semiconductor wafer surface.

Integrated circuits are composed of many overlapping layers, each defined by photolithography. Some layers mark where various dopants are diffused into the substrate (called diffusion layers), some define where additional ions are implanted (implant layers), some define the conductors (polysilicon or metal layers), and some define the connections between the conducting layers (via or contact layers). All components are constructed from a specific combination of these layers.

Figure 1:
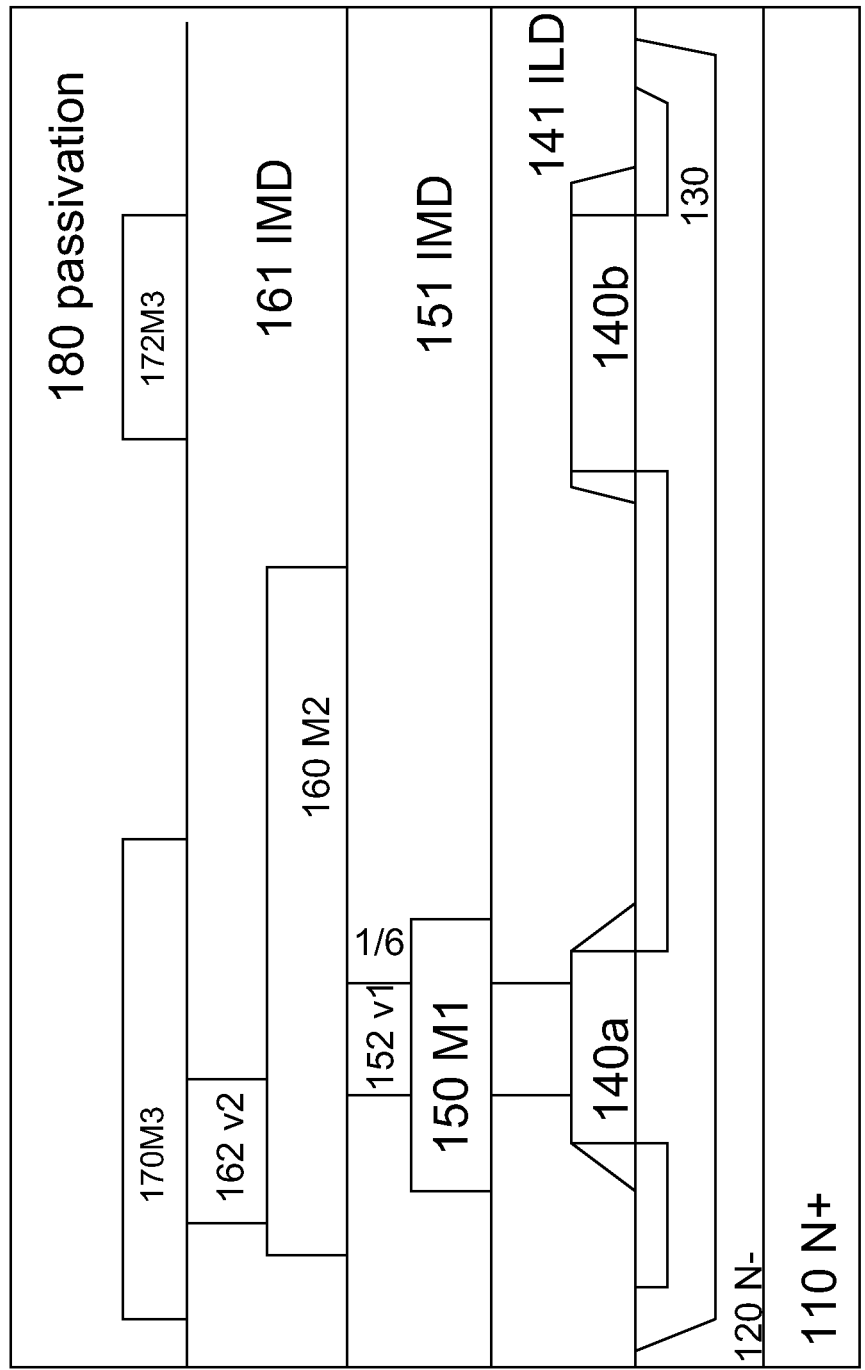
FIG. 1 schematically depicts layers of a CMOS digital device including a passivation layer on top of metal layers.

FIG. 1 shows a CMOS structure built upon a substrate comprising a base N+ material 110 underlying an N- material 120. In this substrate, a P- well 130 has been created. A poly-silicon gate structure 140a and 140b form the gate of both the PMOS and NMOS transistors and connect them. An inter layer dielectric (ILD) layer 141 is formed on top of the gates. A metal one layer 150 M1 is formed on top of the 141 ILD layer and within inter metal layer dielectric (IMD) layer. A second metal layer 160 M2 is formed on top of the 151 IMD layer, wherein the metal layer 160 is connected to 150 M1 layer by 152 via. A third metal layer 170 M3 is formed further on top of the second metal layer 160 M2, separated by the IMD layer 161 and connected to the second metal layer 160 M2 by via 160 v2. Finally, on top of the metal layers, a passivation layer 180 is formed.

FIG. 1 is only an illustrative embodiment of layers used in the processing of CMOS digital circuits. Those of skill in the art will readily recognize that there are many variations which implement equivalent functions and the illustrative embodiments are made for illustrative purpose only. In particular, the individual devices are interconnected using a series of metal depositions and patterning steps of dielectric films (insulators). Current semiconductor fabrication includes many metal layers separated by dielectric layers, which are not shown in FIG. 1.

To protect an integrated circuit from damage and contamination, it is common to apply a passivation layer to the surface of the integrated circuit metal layer to act as a barrier to prevent corrosive chemicals from reaching the integrated circuit. An overlaying oxide passivation layer 180 is on top of the metal layers in FIG. 1. It is known to the skilled in the art that openings (not shown) are etched in this layer to allow access to the top layer of the metal by electrical probes and wire bonds.

For various purposes, further protection layers can be applied on top of a first passivation layer. A polyimide layer can be applied on top of a passivation layer. One illustrative but not limiting purpose of the polyimide layer is the polyimide layer has good mechanical elongation and tensile strength, which also helps the adhesion between the polyimide layers or between polyimide layer and deposited metal layer. The high temperature stability of the polyimide film, results in a system that provides reliable insulation when subjected to various types of environmental stresses. It is also possible that the polyimide layer lies on top of the metal layers directly without other passivation layer.

Further polyimide layers can be applied. For illustrative purpose, a first polyimide layer can lie on top of the metal layers, then an oxide layer lies on top of the first polyimide layer, and lastly a second polyimide layer lies on top of the oxide layer.

Sometimes an additional metal layer called a shield metal layer can be used for additional passivation. One such an illustrative example is where a shield metal layer lies between the two polyimide layers and on top of the oxide layer.

It is known to the skilled in the art that those passivation layers, polyimide layers, oxide layers, and shield metal layer are not used to perform the function a digital circuit is designed for. Instead they are used to protect the digital circuits from corrosive chemicals, temperature, mechanical damages, contaminations, and all other environmental or processing damages to the circuits. Therefore, they all form a large protection layer of a digital circuit which further comprises sub-layers such as passivation layer, polyimide layer, oxide layer, and shield metal layers. The protection layer comprising sub-layers lies directly on top of the metal layer of the circuit with physical contact to the metal layer of the circuit. Modern circuits typically have a protection layer with at least one sub-layer on top of the metal layer of the circuit.

Figure 2:
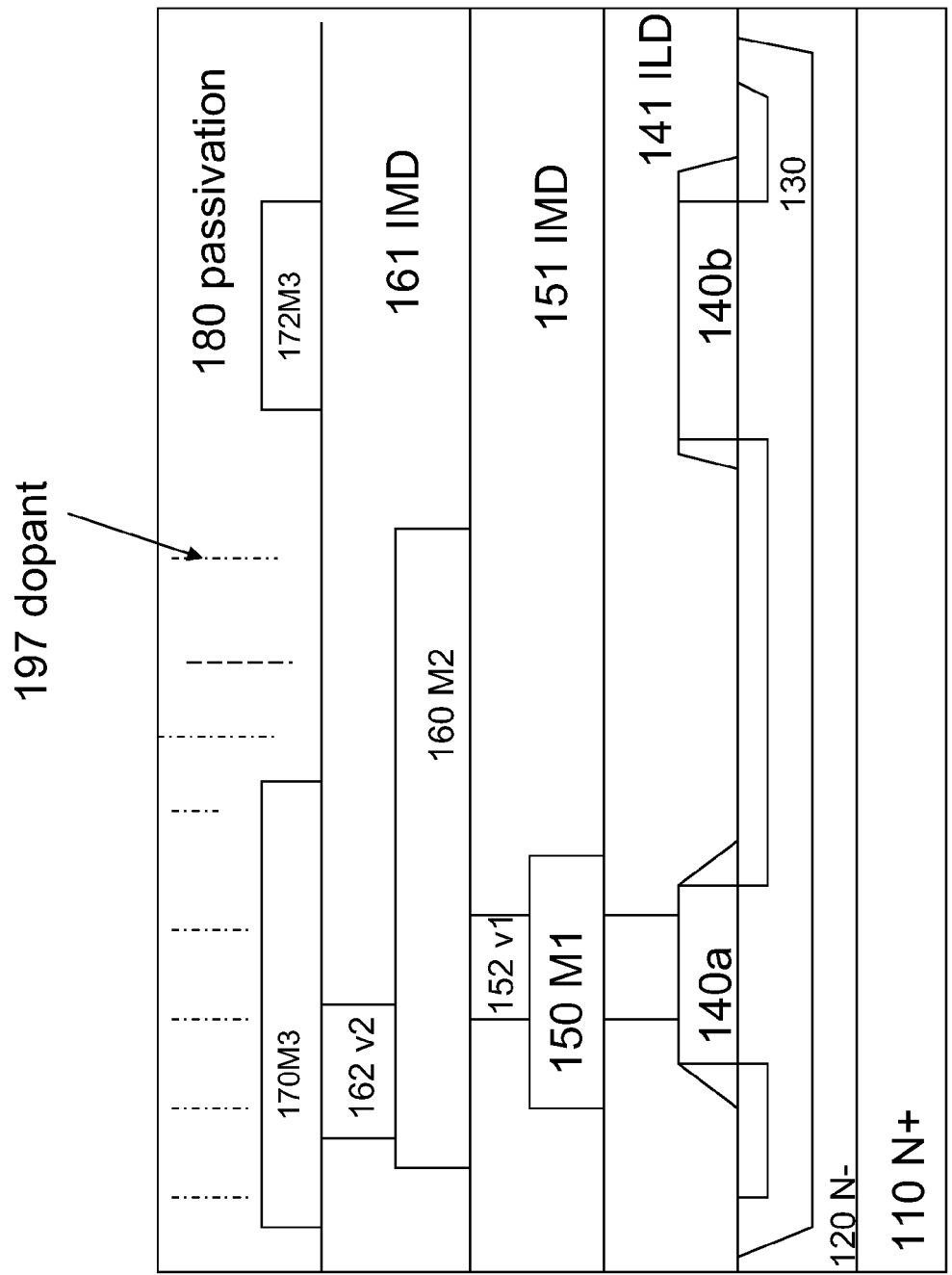
FIG. 2 schematically depicts layers of a CMOS digital device including a passivation layer on top of metal layers, wherein the passivation layer is doped with absorption material.

For a digital circuit shown in FIG. 1 where a protection layer such as a passivation layer is formed for some protection purpose, additional doping of thermal neutron absorption material can be applied to the passivation layer. The result is a digital circuit shown in FIG. 2, where the original passivation layer directly in contact with metal layer has been doped with dopant 197.

The thermal neutron absorbing material can be selected from the group consisting of Gd, Sm, Cd, B, and combinations thereof. The alpha particle or Li can be blocked by the thermal neutron absorbing materials. The doping can be formed by Chemical Vapor Deposition (CVD), or by implanting the material into oxide film.

Figure 3:
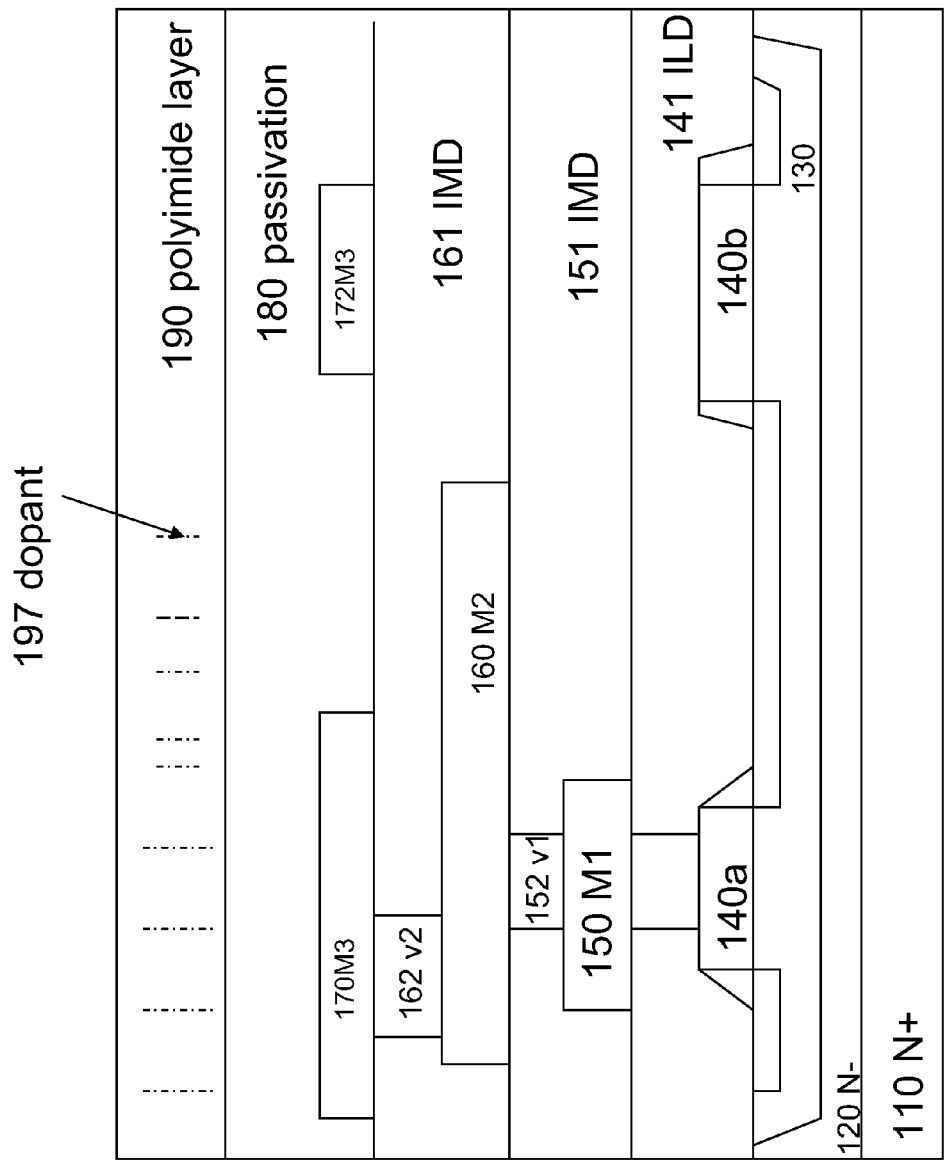
FIG. 3 schematically depicts layers of a CMOS digital device including a polyimide layer in addition to a passivation layer on top of metal layers, wherein the polyimide layer is doped with absorption material.

Similarly, the thermal neutron absorbing material can be doped into other protection layers such as a polyimide layer, resulting in a digital circuit with layers shown in FIG. 3 where the polyimide layer 190 is doped with thermal neutron absorbing material. In FIG. 3 both the polyimide layer 190 and the passivation layer 180 are protection layers which are in direct contact with the metal layer of the digital circuit. Moreover, either the passivation layer 180 or the polyimide layer 190 can be doped with thermal neutron absorbing material, which is not shown in FIG. 3. It is possible that both the passivation layer 180 and the polyimide layer 190 are doped with thermal neutron absorbing materials.

Figure 4:
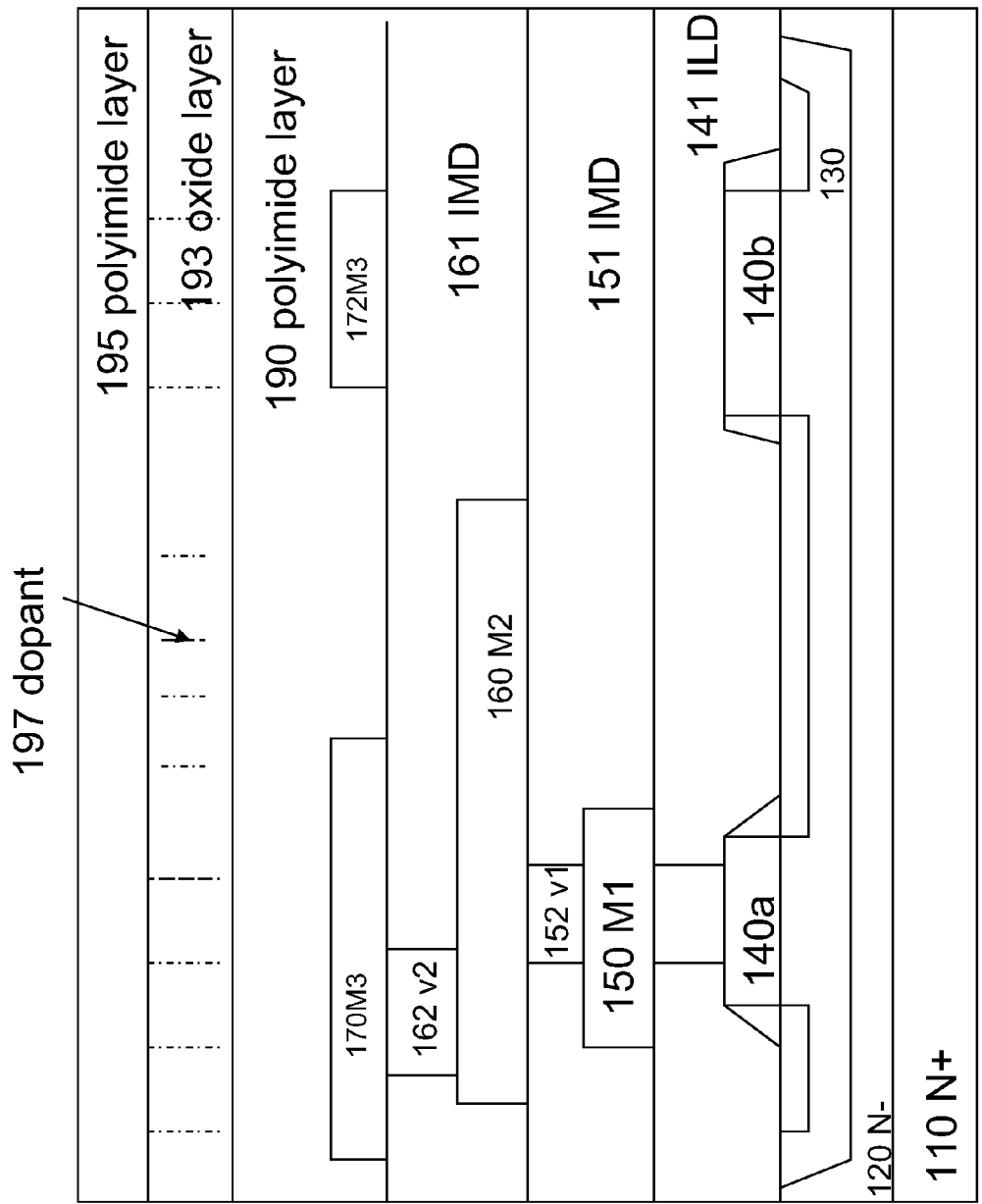
FIG. 4 schematically depicts layers of a CMOS digital device including a first polyimide layer on top of an oxide layer which is further on top of a second polyimide layer, while the second polyimide layer is on top of metal layers, wherein the oxide layer is doped with absorption material.
Figure 5:
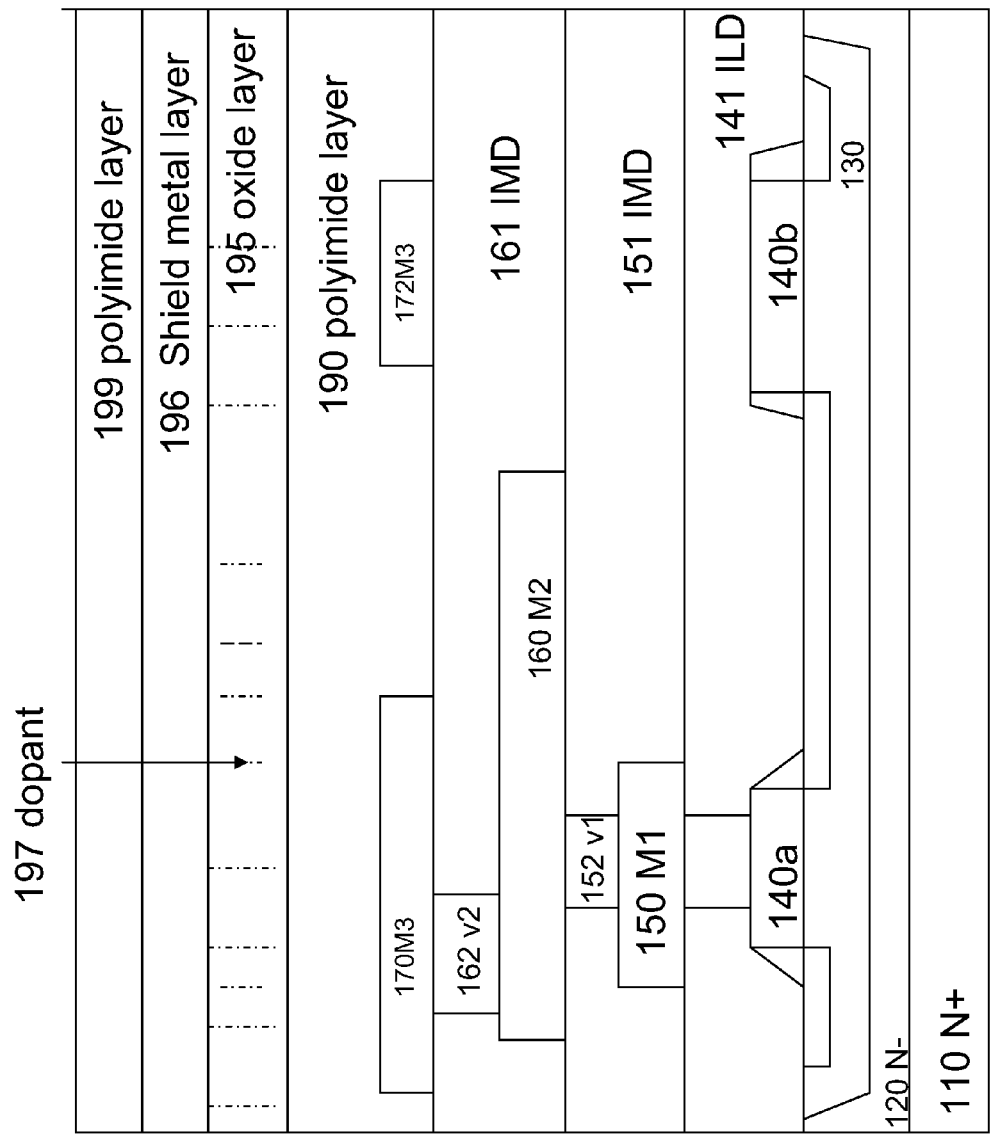
FIG. 5 schematically depicts layers of a CMOS digital device including a first polyimide layer on top of a shield metal layer, which is on top of an oxide layer that is further on top of a second polyimide layer, while the second polyimide layer is on top of metal layers, wherein the oxide layer is doped with absorption material.

For other protection layers such as an oxide layer, thermal neutron absorbing material can be doped into an oxide layer and resulting in digital circuits shown in FIGS. 4 and 5 respectively. It is known to those skilled in the art that for FIGS. 4 and 5, any one of the protection layers or a combination of them can be doped with thermal neutron absorbing material for the purpose to reduce soft error rate of the digital circuits.

Figure 6:
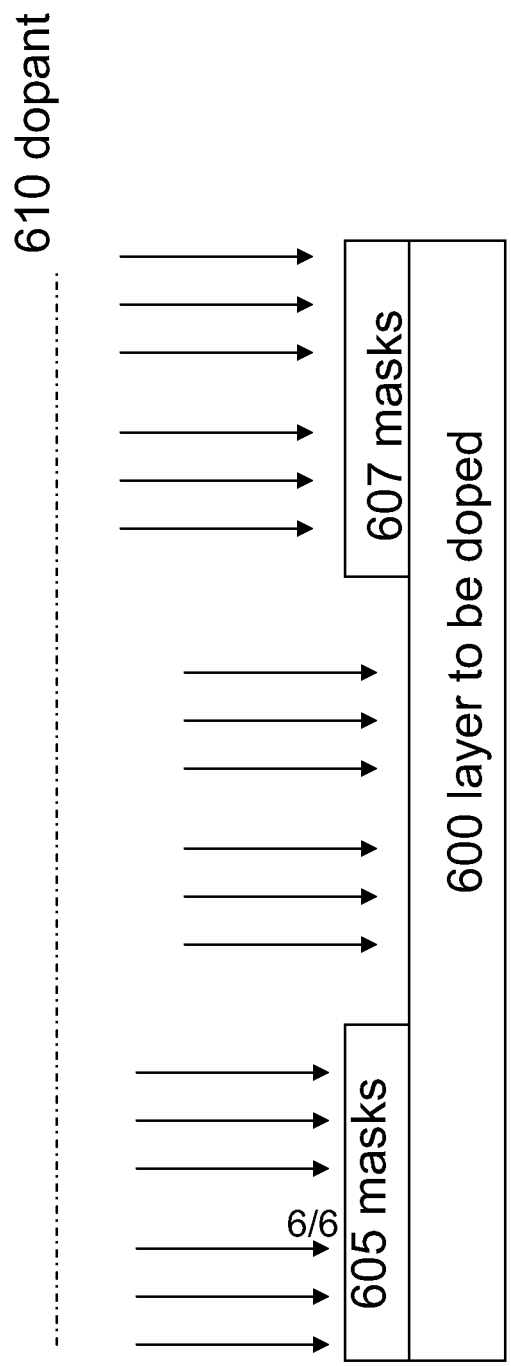
FIG. 6 depicts an example of embodiment wherein a passivation layer doping or polyimide layer doping is to use implant and select a specific dopant.

FIG. 6 shows a process where the thermal neutron absorbing material is implanted into the protection layers as shown in FIG. 2 to FIG. 5, or similar variations of such layers. Two masks 605 and 607 are placed on top of the 600 layer to be doped to cover up areas where the doping may not be applied. The dopant 610 is then implanted into the layer 600 to be doped.

Although exemplary embodiments and their advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An integrated circuit comprising:
a substrate layer having an active device disposed thereon;
a dielectric layer disposed over the active device;
a metal layer disposed over the dielectric layer, the metal layer electrically connected to the active device by metal features disposed in the dielectric layer; and
a protection layer on top of the metal layer and in physical contact with the metal layer, wherein a first portion of the protection layer contains a thermal neutron absorbing material that is an elemental impurity selected from the group consisting of Gd, Sm, Cd, and combinations thereof, wherein the first portion of protection layer extends past the metal layer and contacts a topmost surface of the dielectric layer, and wherein at least a portion of the thermal neutron absorbing material is disposed below a topmost surface of the metal layer.

2. The integrated circuit of claim 1, wherein:
the protection layer comprises a passivation layer including the thermal neutron absorbing material.

3. The integrated circuit of claim 2, wherein:
the protection layer including the thermal neutron absorbing material is formed by implanting an additional thermal neutron absorbing material into the passivation layer.

4. The integrated circuit of claim 1, wherein:
the protection layer comprises a polyimide layer including the thermal neutron absorbing material.

5. The integrated circuit of claim 4, wherein:
the protection layer including the thermal neutron absorbing material is formed by implanting an additional thermal neutron absorbing material into the polyimide layer.

6. The integrated circuit of claim 1, wherein:
the protection layer comprises an oxide layer and a polyimide layer including the thermal neutron absorbing material.

7. The integrated circuit of claim 6, wherein:
the protection layer including the thermal neutron absorbing material is formed by implanting the thermal neutron absorbing material into the oxide layer.

8. The integrated circuit of claim 6, wherein:
the protection layer including the thermal neutron absorbing material is formed by chemical vapor deposition (CVD).

9. The integrated circuit of claim 1, wherein:
the protection layer comprises a plurality of sub-layers among which at least one contains an additional thermal neutron absorbing material.

10. The integrated circuit of claim 9, wherein the protection layer comprises the plurality of sub-layers including:
a first polyimide sub-layer on the metal layer;
an oxide sub-layer above the first polyimide sub-layer;
a second polyimide sub-layer above the oxide sub-layer; and
wherein at least one of the plurality of sub-layers contains an additional thermal neutron absorbing material.

11. The integrated circuit of claim 9, wherein the protection layer comprises the plurality of sub-layers including:
a first polyimide sub-layer on the metal layer;
a shielding metal sub-layer above the first polyimide sub-layer;
an oxide sub-layer above the shielding metal sub-layer;
a second polyimide sub-layer above the oxide sub-layer; and
wherein at least one of the plurality of sub-layers contains an additional thermal neutron absorbing material.

12. An integrated circuit (IC) comprising:
a substrate layer;
a transistor disposed in the substrate layer;
an intermetal dielectric layer disposed over the transistor;
a metal layer having a bottommost surface on the topmost surface of the intermetal dielectric layer, wherein the metal layer is in electrical communication with the transistor; and
a passivation layer on the metal layer, the passivation layer in physical contact with the metal layer and the intermetal dielectric layer, wherein the passivation layer is doped substantially throughout with a thermal neutron absorbing material that is an elemental impurity selected from the group consisting of Gd, Sm, Cd, and combinations thereof.

13. The integrated circuit of claim 12, further comprising a polyimide layer above the passivation layer, wherein the polyimide layer comprises the thermal neutron absorbing material.

14. The integrated circuit of claim 12, further comprising an oxide layer and a polyimide layer above the passivation layer, wherein either the oxide layer or the polyimide layer comprises the thermal neutron absorbing material.

15. The integrated circuit of claim 12, further comprising:
a first polyimide layer above the passivation layer;
an oxide layer above the first polyimide layer;
a second polyimide layer above the oxide layer; and
wherein at least one of the first polyimide layer, the oxide layer, and the second polyimide layer comprises the thermal neutron absorbing material.

16. The integrated circuit of claim 12, further comprising:
a first polyimide layer above the passivation layer;
a shielding metal layer above the first polyimide layer;
an oxide layer above the shielding metal layer;
a second polyimide layer above the oxide layer; and
wherein at least one of the first polyimide layer, the shielding metal layer, the oxide layer, and the second polyimide layer comprises the thermal neutron absorbing material.

17. The integrated circuit of claim 16, wherein:
the oxide layer comprises the thermal neutron absorbing material, formed by implanting the thermal neutron absorbing material into the oxide layer.

18. An integrated circuit (IC) comprising:
a substrate layer;
a metal layer above the substrate layer;
a passivation layer on the metal layer and in physical contact with the metal layer; and
a protection layer above the passivation layer and in physical contact with the passivation layer, wherein the protection layer comprises an oxide layer over the passivation layer, wherein the protection further comprises a polyimide layer over the oxide layer, wherein the oxide layer contains a thermal neutron absorbing material that is an elemental impurity selected from the group consisting of Gd, Sm, Cd, and combinations thereof.

19. The integrated circuit of claim 18, wherein:
the protection layer comprises a plurality of sub-layers among which at least one contains the thermal neutron absorbing material.

* * * * *